United States Patent [19]
Watanabe

[11] 3,891,867
[45] June 24, 1975

[54] VARIABLE IMPEDANCE CIRCUIT

[75] Inventor: Yasuaki Watanabe, Kasugabe, Japan

[73] Assignee: Victor Company of Japan, Limited, Kanagawa-ken, Japan

[22] Filed: Oct. 25, 1973

[21] Appl. No.: 409,443

[30] Foreign Application Priority Data

Oct. 31, 1972 Japan .............................. 47-109352
Oct. 31, 1972 Japan .............................. 47-109353
Dec. 28, 1972 Japan .............................. 48-3461

[52] U.S. Cl. .................. 307/264; 307/237; 330/24; 330/29

[51] Int. Cl. .......................... H03k 1/14; H03g 3/00

[58] Field of Search ......... 307/237, 264; 330/24, 29

[56] References Cited

UNITED STATES PATENTS 3,248,661 4/1966 Beszedics .............................. 330/24
3,539,826 11/1970 Crouse .............................. 330/29 X
3,579,133 5/1971 Harford .............................. 330/29 X

*Primary Examiner*—John Zazworsky
*Attorney, Agent, or Firm*—Holman & Stern

[57] ABSTRACT

A variable impedance circuit comprises a transistor for varying impedance, a resistor connected between the collector and base of the transistor, a diode connected to the base of the transistor with a polarity opposite that of an equivalent diode between the base and emitter of the transistor, and a variable voltage source for control connected to the diode and operating to vary voltage. The impedance between the collector and ground of the transistor is varied with excellent linearity in accordance with the value of the voltage of the variable voltage source.

6 Claims, 10 Drawing Figures

VARIABLE IMPEDANCE CIRCUIT

BACKGROUND OF THE INVENTION

This invention relates generally to variable impedance circuits and more particularly to a variable impedance circuit including a transistor which varies its impedance in accordance with a control voltage applied thereon and exhibiting characteristics of excellent linearity.

In general, in circuits such as automatic gain-control circuits and noise-reduction circuits, variable impedance circuits having impedances, which vary when DC voltages applied thereon are controlled, are used as control circuits. As voltage-resistance conversion means used in variable impedance circuits of this type, diodes have been used, and there have been those in which the current dependency of the resistance in the forward direction thereof is utilized and those in which transistors are used and the collector output resistance thereof is utilized.

However, as described hereinafter, the voltage-current characteristic of a diode or a transistor is greatly curved and has linear and nonlinear characteristic parts. For this reason, in cases where a conventional variable impedance circuit is used, particularly in circuits dealing with AC signals of relatively large amplitude such as video signals, distortion is produced in these signals.

SUMMARY OF THE INVENTION

Accordingly, it is a general object of the present invention to provide a new and useful variable impedance circuit in which the above described difficulty is overcome.

A specific object of the invention is to provide a variable impedance circuit of excellent linearity of volt-ampere static characteristic. In the case where the circuit of the present invention is applied as a variable resistance circuit of a gain control circuit, it is possible to accomplish gain control with excellent linearity over a wide range and, therefore, with excellent linearity of also signals of large amplitude such as video signals.

Another object of the invention is to provide a variable impedance circuit in which there is provided a transistor whose emitter is grounded (earthed) with an amply low impedance relative to alternating current and, moreover, with a specific impedance relative to direct current, and the base of this transistor is connected, by way of a diode of a polarity opposite that of an equivalent diode formed between that base and the emitter, to a control voltage source of an impedance which is amply low relative to alternating current. It has been found that the circuit of the invention as summarized above and described in detail hereinafter has a very stable operation.

Further objects and features of the present invention will be apparent from the following detailed description with respect to preferred embodiments of the invention when read in conjunction with the accompanying drawings.

DETAILED DESCRIPTION

Figure 1:
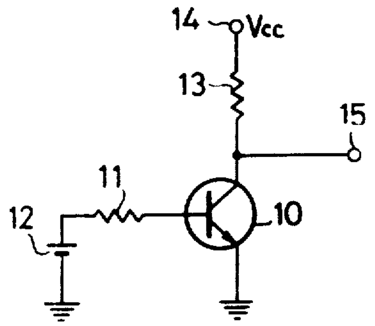
FIG. 1 PRIOR ART
FIG. 1 is a circuit diagram of one example of a variable impedance circuit known in the prior art.

As conducive to a full understanding of the present invention, the difficulties accompanying a known variable impedance circuit will first be described in conjunction with FIGS. 1 and 2. This circuit of the prior art has a transistor 10 serving as a variable impedance element. The base of this transistor 10 is connected, by way of a resistor 11 for supply of base current, to a variable voltage source 12 for control, while the emitter is grounded. The collector of this transistor is connected, by way of a collector load resistor 13, to a terminal 14 on which a power source voltage Vcc for operation is applied. This collector is also connected to an output terminal 15.

Figure 2:
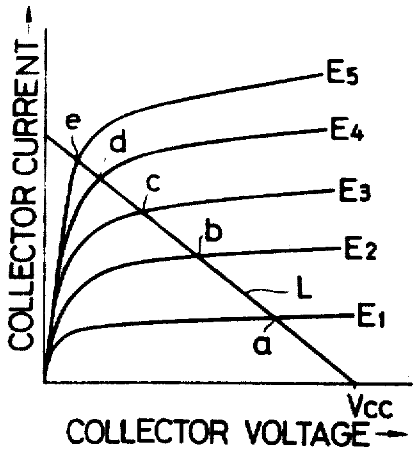
FIG. 2 is a graph indicating the collector voltage versus collector current characteristic of a generally known transistor.

The collector voltage versus collector current characteristic of the transistor 10 of the circuit of the above described organization is shown in FIG. 2. In this graphical representation, the parameter represented by the curves E1 through E5 is the value of the variable control voltage of the variable voltage source 12 for control, and their values have the relationship of E5 > E4 > E3 > E2 > E1. As is known, the operating point of the transistor 10 for each control voltage has a slope $-1/RL$, where $RL$ is the resistance value of the load resistor 13 and, moreover, lies on a straight line $L$ passing through the power supply voltage Vcc for operation on the collector voltage axis. Therefore, the intersections of the static characteristic curves corresponding to the control voltages E1 through E5 and the straight line $L$ are as designated by points $a$, $b$, $c$, $d$, and $e$.

The resistance value as viewed from the collector terminal of the transistor 10 toward the interior of the transistor is determined by the static characteristic curve of the transistor at each of the operating points $a$ through $e$ and is given by $1/P$, where $P$ is the slope of the static characteristic curve at each of the points $a$ through $e$. Accordingly, as the value of the voltage of the variable voltage source 12 for control increases from E1 toward E2, that is, as the above mentioned slope $P$ increases, the value of the resistance as viewed from the output terminal 15 toward the side of the transistor 10 decreases. Therefore, by controlling the voltage of the variable voltage source 12 for control, the resistance value of the transistor 10 can be controlled.

The static characteristic curves of the transistor at the points *c*, *d*, and *e*, where the resistance values vary greatly because of the variable voltage source 12 for control, have great curvatures at these operating points *c*, *d*, and *e* and exhibit a so-called nonlinear resistance characteristics.

However, even when the operating point of the transistor 10 is so set as to obtain a certain necessary resistance value in a variable impedance circuit of known construction as described above, distortion is produced in the signal when this circuit is used for AC signals, such as a video signals, of relatively large amplitude because of the curvature in the characteristic in the vicinity of this operating point. This has been a difficult problem accompanying this known circuit. Conversely, therefore, in order to suppress the distortion within a practical allowable limit, a signal of large amplitude cannot be handled. For instance, in the case where the above described variable impedance circuit is used for a variable gain control circuit, it can deal with input signals of the order of up to only 50 mVp-p.

Figure 3:
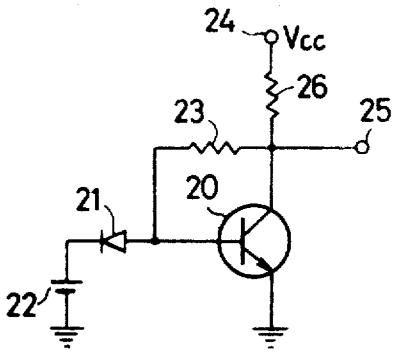
FIG. 3 is a circuit diagram showing a basic circuit construction of the variable impedance circuit according to the invention.

The present invention succeeds in overcoming these difficulties as will be apparent from the following description thereof with reference to FIG. 3 and succeeding figures.

FIG. 3 shows the fundamental circuit organization of the variable impedance circuit according to the invention. The base of an NPN transistor 20 used as a variable impedance element is connected to the anode of a diode 21, the cathode of which is connected to a variable voltage source 22 for control. A resistor 23 is connected between the collector and base of the transistor 20. The collector is connected by way of a current-supply resistor 26 to a terminal 24 of a power supply Vcc for operation and to an output terminal 25.

By thus connecting the diode 21 and the resistor 23, the resistance value of the transistor 20 at the output terminal 25 is varied with excellent linearity in accordance with the voltage value of the variable voltage source 22 for control as described hereinafter with respect to a practical circuit in conjunction with analytical equations.

In the case where a PNP transistor is employed for the transistor 20, the polarity of the diode 21 becomes opposite that indicated in FIG. 3. That is, the polarity of the diode 21 should be opposite that of an equivalent diode characteristic between the base and emitter of the transistor 20.

Figure 4:
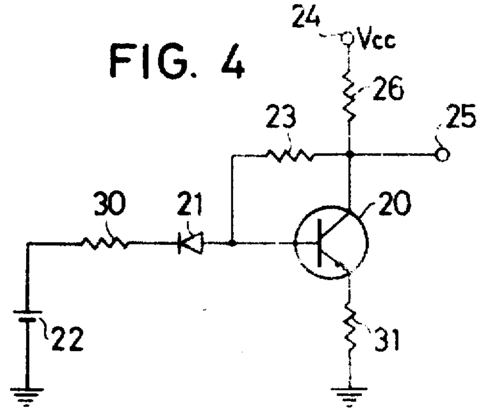
FIG. 4 is a circuit diagram of one embodiment of a practical circuit construction of the variable impedance circuit according to the invention.

One embodiment of a practical circuit construction of a variable impedance circuit according to the invention is shown in FIG. 4, in which parts which are the same or equivalent to those in FIG. 3 are designated by like reference numerals.

In the case where the circuit shown in FIG. 3 is to be utilized in actual practice, quantities such as the internal resistance of the variable voltage source 22 for control must be taken into consideration. This internal resistance is indicated in FIG. 4 as a resistor 30 connected between the diode 21 and the voltage source 22. Then, in the instant embodiment, in order to decrease the nonlinearity of the collector output resistance of the transistor 20 due to the existence of this resistor 30, a resistor 31 is connected between the emitter of the transistor 20 and ground (earth).

Figure 5:
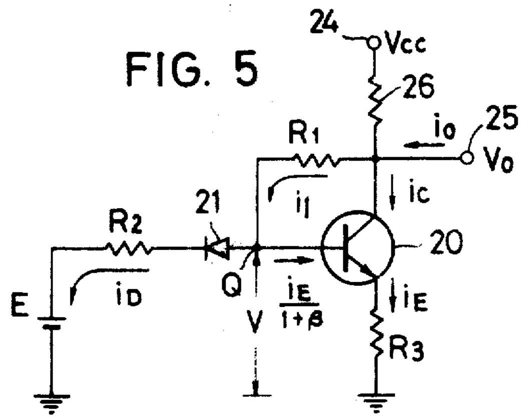
FIG. 5 is a circuit diagram for a description of the operation of the circuit shown in FIG. 4.

Then, when the values of the resistors 23, 30, and 31 are denoted by R1, R2, and R3, the voltage of the variable voltage source 22 for control is denoted by E, and the current amplification factor of the transistor 20 is denoted by $\beta$, the circuit shown in FIG. 4 can be represented as in FIG. 5. Then the relationships between the voltages and currents in various parts of the circuit in FIG. 5 can be represented as follows.

$$i_D = i_{S1} \cdot e^{K(V-E-i_D R2)} \tag{1}$$

$$i_E = i_{S2} \cdot e^{K(V-i_E R3)} \tag{2}$$

$$i_D = \frac{Vo - V}{R1} - \frac{i_E}{1+\beta} \tag{3}$$

where:

$i_D$ is a current flowing through the diode 21 in the arrow direction in FIG. 5;

$i_{S1}$ is the saturation current of the diode 21;

$V$ is the base voltage of the transistor 20;

$i_E$ is the emitter current of the transistor 20;

$i_{S2}$ is the saturation current of the transistor 20; and $Vo$ is the voltage on the terminal 25.

Furthermore, K = q/kT;

where:

$q$ is the charge of electrons;

$k$ is the Boltzmann constant; and $T$ is the absolute temperature.

From the above Eq. (1), the base voltage $V$ of the transistor 20 is obtained as follows.

$$V = \frac{1}{K} \ln \frac{i_D}{i_{S1}} + E + i_D R2 \tag{4}$$

By substituting this Eq. (4) in Eq. (3), the emitter current $i_E$ can be expressed by the following equation.

$$i_E = i_{S2} e^{\left\{ \ln \frac{i_D}{i_{S1}} + K(E + i_D R2 - i_E R3) \right\}}$$

$$= \frac{i_{S2}}{i_{S1}} i_D e^{KE} \cdot e^{K(i_D R2 - i_E R3)} \tag{5}$$

Here, for the sake of simplicity, it will be assumed that the transistor 20 and the diode 15 are both of the same semi-conductor material, for example, silicon. Then $i_{S1} \approx i_{S2}$ and Eq. (5) becomes $$i_E \approx i_D e^{KE} \cdot e^{K(i_D R2 - i_E R3)} \tag{6}$$

Furthermore, in the case of the circuit shown in FIG. 3, that is in the case where R2 = 0 and R3 = 0, Eq. (5) becomes $$i_E = i_D e^{KE} \tag{7}$$

When the emitter current $i_E$ is determined from Eqs. (7) and (3), the following equation is obtained.

$$i_E = \frac{Vo - V}{R1} \cdot e^{KE} \Big/ \left( 1 + \frac{e^{KE}}{1+\beta} \right) \tag{8}$$

Here, the output current $i_o$ is equal to $i_c + i_1$, where $i_c$ is the collector current of the transistor 20, and $i_1$ is a current flowing through the resistor R1, but since the current amplification factor $\beta$ of the transistor 20 is ordinarily extremely large, it may be considered that $i_c \approx i_E$. Furthermore, since the current $i_1$ is given by $i_1 = (Vo - V)/R1$, the output current $i_o$ is given by the following Eq. (9).

$$i_o \approx \frac{1}{R1} \left( 1 + \frac{e^{KE}}{1 + \frac{e^{KE}}{1+\beta}} \right) Vo - V) \qquad (9)$$

The base voltage $V$ of the transistor 20 is of a substantially constant value determined by the material of this transistor 20 when it is in its operative region. For example, the base voltage $V$ is approximately 0.65 volts in the case where the semiconductor material thereof is silicon and is approximately 0.2 volts in the case where the material is germanium.

It is apparent, therefore, that the output end current $i_o$ at the output terminal 25 has a proportionality constant determined by the voltage E of the variable voltage source 22 for control and increases linearly with increase in the output end voltage $Vo$.

Figure 6:
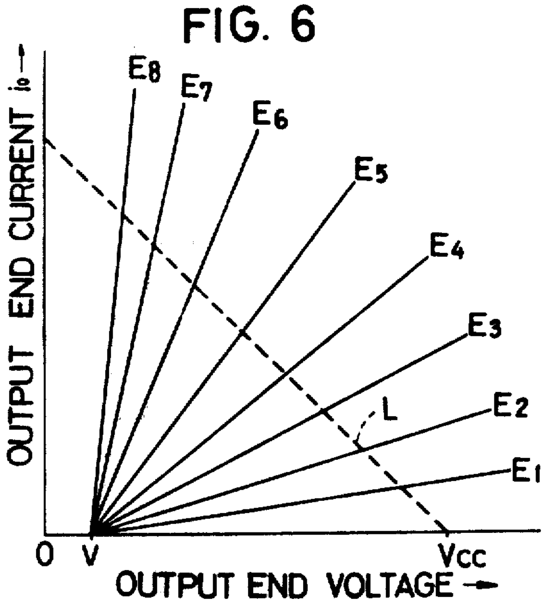
FIG. 6 is a graph indicating the output end voltage versus output end current characteristic of the circuit shown in FIG. 4.

The characteristic of this output end current $i_o$ versus the output end voltage $Vo$ is indicated in FIG. 6. This graph indicates that, as the value of voltage of the variable voltage source 22 for control increases as E1, E2, . . . E8, the output end current $i_o$ increases linearly relative to the output end voltage $Vo$ with a constant slope determined by these voltage values. That is, it is apparent from this graph that a variable impedance circuit of excellent linearity is obtained.

Furthermore, it is apparent from the above Eq. (5) that, in the case of the circuit shown in FIG. 4, a characteristic closely similarly to that in the case of the circuit shown in FIG. 3 can be obtained provided that the condition of the following equation is satisfied.

$$K(i_D R2 - i_E R3) << 1 \qquad (10)$$

By writing the above Eq. (10) as $$K(i_D R2 - i_E R3) = 0 \qquad (11)$$

and substituting therein the above Eq. (3), the following equation is obtained.

$$R2 \; \frac{Vo - V}{R1} - \frac{e^{KE}}{1+\beta} - i_E R3 = 0 \qquad (12)$$

Therefore, the following equation is derived.

$$R3 \cong \frac{R2}{R1} \cdot \frac{Vo - V}{i_E} \qquad (13)$$

That is, by using resistances of resistance values having the relationship of Eq. (13) for the resistors R1, R2, and R3, it is possible to realize a variable impedance circuit which can be controlled by voltage similarly as in the case illustrated in FIG. 3 and has excellent linearity.

Another advantageous feature of the circuit of the present invention is that it is possible to match the temperature characteristic between the base and emitter of the transistor 20 and to hold variations in the characteristics due to temperature to a minimum.

Figure 7:
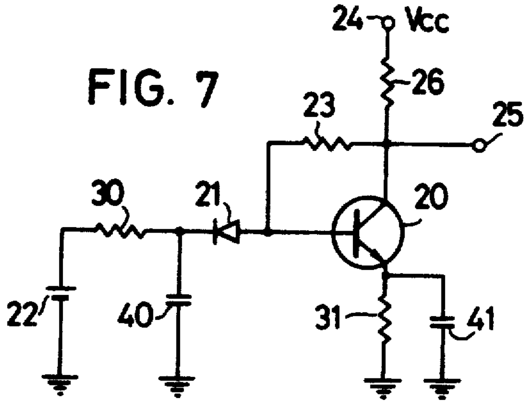
FIG. 7 is a circuit diagram showing another embodiment of a practical circuit construction of the variable impedance circuit according to the invention.

Next, another embodiment of a practical circuit construction of the variable impedance circuit according to the invention will described in conjunction with FIG. 7. This circuit results from a further stabilization, relative to direct current, of the operation of the circuit of the preceding embodiment.

Parts in FIG. 7 which are the same as those in FIGS. 3 and 4 are designated by the same reference symbols, and detailed description thereof will not be repeated. The circuit shown in FIG. 7 differs from that shown in FIG. 4 in that the junction between the resistor 30 and the diode 21 is grounded through a capacitor 40 of amply low impedance relative to alternating current, and in that, furthermore, the emitter of the transistor 20 is grounded through a capacitor 41 of amply low impedance with respect to alternating current connected in parallel with a resistor 31.

When the circuit shown in FIG. 7 is considered in relation to direct current, the following relationships are obtained.

$$i_E \cdot R3 = i_D \cdot R2 + E \qquad (14)$$

$$V = i_E \cdot R3 + V \qquad (15)$$

where: $V_{BE}$ is the voltage between the base and emitter of the transistor 20.

Then, when the output current $i_o$ is determined from the above Eqs. (14), (15), and (3), as well as the above set forth relationships $i_1 = (Vo - V)/R1$ and $i_o = i_c + i_1$, with the introduction of the condition $i_c \approx i_E$, the following relationship is obtained.

$$i_o = \frac{R_2}{R1(R3 + \frac{R2 \cdot R3}{R1} + \frac{R2}{1+\beta}} \; 1 + \frac{R3}{R1} + \frac{1}{R1} \; Vo - V_{BE} + \frac{E}{R3 + \frac{R2 \cdot R3}{R1} + \frac{R2}{1+\beta}} \times 1 - \frac{R3}{R1} \qquad (16)$$

Figure 8:
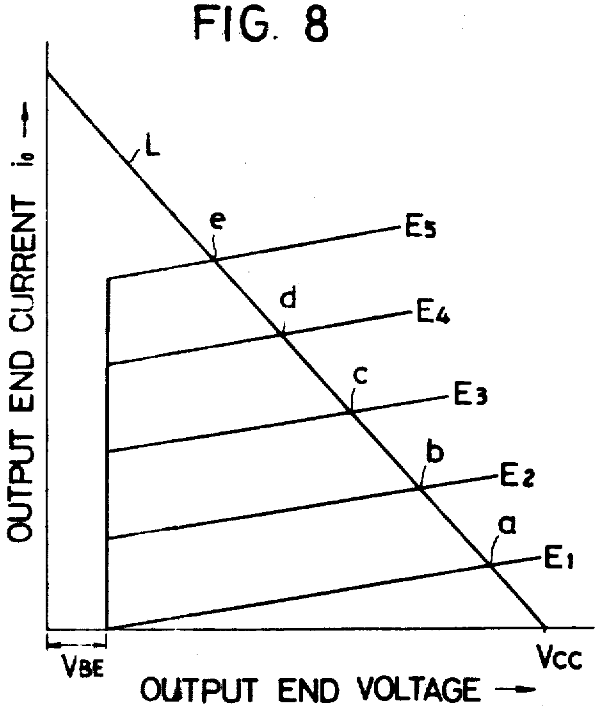
FIG. 8 is a graph indicating the output end voltage versus output end current characteristic of the circuit shown in FIG. 7.

While the equivalent circuit of the circuit of FIG. 7 as viewed with respect to direct current is as indicated in FIG. 5, the resistance component in this case is of a very large value of an order which cannot be neglected, and the characteristic of the output current $i_o$ expressed by Eq. (16) becomes as indicated in FIG. 8. The slopes of the full lines shown as the parameter of voltages E1, E2, . . . of the static characteristic indicated in FIG. 8 are determined by the resistance values R1, R2, and R3 of the resistors 23, 30, and 31. Furthermore, the space intervals between these full lines are determined by the voltage value E of the control voltage source 22 and the resistance values of the resistors R1, R2, and R3. The operating points *a, b, c, d,* and *e* indicated by the intersections of these full lines with the straight line L are determined by the value of the power source voltage Vcc for operation, the resistance value of the resistor 26, and the value of the voltage of the control voltage source 22.

On the other hand, when the circuit shown in FIG. 7 is considered with respect to alternating current, the junction between the resistor 30 and the diode 21 and the emitter of the transistor 20 are grounded respectively by way of capacitors 40 and 41 with low impedance relative to alternating current. Accordingly, its equivalent circuit can be represented by a circuit construction similar to that shown in FIG. 3.

In this case, similarly as in the preceding embodiment, an output current $i_o$ represented by the above derived Eq. (9) is obtained.

Next, embodiments of gain-control circuits in which the variable impedance circuit of the present invention is utilized will be described in conjunction with FIGS. 9 and 10.

Figure 9:
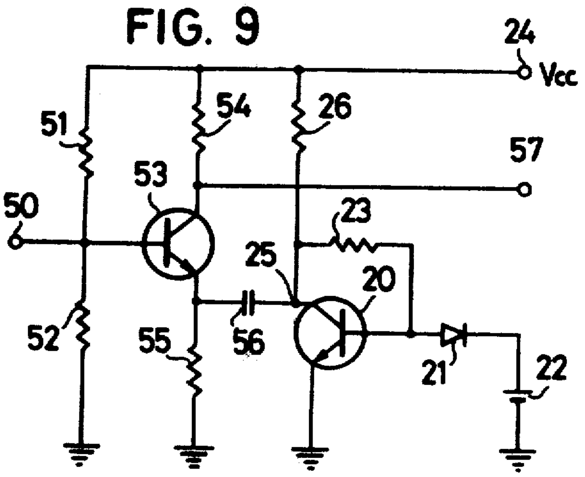
FIG. 9 is a circuit diagram showing one embodiment of a gain-control circuit to which the variable impedance circuit of the invention is applied.

In the circuit of the embodiment shown in FIG. 9, the variable impedance circuit shown in FIG. 3 is used, and parts which are the same in FIGS. 3 and 9 are designated by the same reference symbols. The base of a transistor 53 is biased by resistors 51 and 52. The collector of this transistor is connected by way of a collector load resistor 54 to a terminal 24, while the emitter is grounded through an emitter resistor 55. The output terminal 25 of the variable impedance circuit illustrated in FIG. 3 is connected through a capacitor 56 to the emitter of this transistor 53.

An input signal applied to an input terminal 50 is amplified by the transistor 53, and the resulting output thereof is led out through an output terminal 57 connected to the collector thereof. The amplification degree of this amplification circuit of emitter-grounded type is given, as an approximation, by the fraction: (collector side load resistance) / (emitter side resistance). Accordingly, the resistance component of the above mentioned variable impedance circuit connected in parallel with the resistor 55 through the capacitor 56 varies in accordance with variation in the voltage of the variable voltage source 22, whereby the resistance on the emitter side of the transistor 20 varies equivalently, and control of the amplification gain of the transistor 20 is accomplished.

During this operation, the variable impedance circuit comprising essentially the transistor 20, the diode 21, the variable voltage source 22, and the resistor 23 is capable of varying impedance with excellent linearity as mentioned hereinbefore. For this reason, the gain-control characteristic is also excellent.

Figure 10:
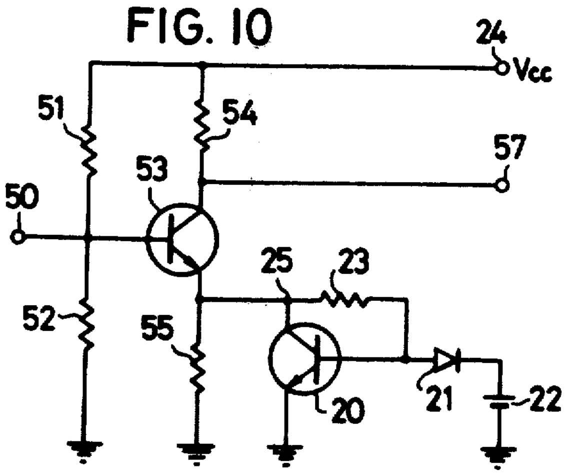
FIG. 10 is a circuit diagram showing another embodiment of this gain control circuit.

The parts in FIG. 10, showing another embodiment of a gain-control circuit, which are same as those in FIG. 9 are designated by like reference symbols, and detailed description of such parts will not be repeated. In the circuit of the instant embodiment, the resistor 26 and capacitor 56 in the circuit shown in FIG. 9 are not used, and the output terminal 25 of the collector of the transistor 20 is connected directly to the emitter of the transistor 53.

In this circuit, the collector of the transistor 20 is connected relative to direct current to the emitter to the emitter of the transistor 53, and the collector voltage of the transistor 20 for variable impedance is given by the emitter voltage of the transistor 53 for amplification. However, since the output-end voltage-current characteristic of the terminal 25 is linear as described hereinbefore, excellent gain control can be accomplished similarly as in the circuit of the preceding embodiment.

Further, this invention is not limited to these embodiments but various variations and modifications may be made without departing from the scope and spirit of the invention.

What I claim is:

1. A variable impedance circuit comprising: a transistor having a grounded emitter, and a collector connected to a power source through a load resistor; a first resistor connected between the collector and the base of said transistor; a diode connected to said base of the transistor with a polarity opposite that of an equivalent diode between said base and emitter of the transistor, the semi-conductor material of said diode being the same as that of said transistor; and a variable voltage source for control connected serially through said diode to said base of said transistor and operating to vary voltage, the impedance between the collector of the transistor and ground being varied linearly according to the value of the voltage of said variable voltage source.

2. A variable impedance circuit as set forth in claim 1 which further comprises a second resistor connected between the emitter of said transistor and ground, the resistance value R3 of said second resistor being determinable according to the following formula:

$$R3 \approx \frac{R2}{R1} \cdot \frac{Vo - V}{i_E}$$

wherein:

$R1$ is the resistance value of said first resistor, $R2$ is the internal resistance value of said variable voltage source, $Vo$ is the potential voltage at the collector of said transistor, $V$ is the potential voltage at the base of said transistor, and $i_E$ is the emitter current in said transistor.

3. A variable impedance circuit as set forth in claim 1 in which said transistor is of NPN type, and said diode has an anode connected to the base of the transistor and the first resistor and has a cathode connected to said variable voltage source.

4. A variable impedance circuit as set forth in claim 2 which further comprises a first capacitor connected between the junction of the variable voltage source and the diode and ground thereby to cause said variable voltage source to exhibit an amply low impedance relative to alternating current and a second capacitor connected in parallel with said second resistor between the emitter of the transistor and ground thereby to ground said emitter with an amply low impedance relative to alternating current.

5. In a gain control circuit having a transistor amplification circuit including a first transistor of emitter-grounded type having an emitter connected to ground through a first resistor, a base to which an input is applied, and a collector connected to a power source for operation through a first load resistor, an output being led out of the collector, a variable impedance circuit comprising a second transistor having a grounded emitter and a collector connected to the emitter of said first transistor; a second resistor connected between the collector and base of said second transistor; a diode connected to the base of the second transistor with a polarity opposite that of an equivalent diode between the base and emitter of the second transistor, the semiconductor material of said diode being the same as that of said second transistor; and a variable voltage source for control serially connected to said diode and operating to vary voltage.

6. A variable impedance circuit as set forth in claim 5 which further comprises a capacitor connected between the emitter of the first transistor and the collector of the second transistor, and a second load resistor connected between the collector of the second transistor and the power source for operation.

* * * * *